United States Patent
Kim et al.

(10) Patent No.: US 10,296,226 B2
(45) Date of Patent: May 21, 2019

(54) CONTROL LOGIC, SEMICONDUCTOR MEMORY DEVICE, AND OPERATING METHOD

(71) Applicant: SK hynix Inc., Icheon-si, Gyeonggi-do (KR)

(72) Inventors: Sung Ho Kim, Cheongju-si (KR); Min Sang Park, Cheongju-si (KR); Yong Seok Suh, Daegu (KR); Kyong Taek Lee, Sejong-si (KR); Gil Bok Choi, Daejeon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/177,109

(22) Filed: Oct. 31, 2018

(65) Prior Publication Data

US 2019/0065059 A1    Feb. 28, 2019

Related U.S. Application Data

(62) Division of application No. 15/642,606, filed on Jul. 6, 2017, now Pat. No. 10,146,442.

(30) Foreign Application Priority Data

Dec. 29, 2016    (KR) .................. 10-2016-0182710

(51) Int. Cl.
   *G06F 3/06*    (2006.01)
   *G11C 16/16*    (2006.01)
   (Continued)

(52) U.S. Cl.
   CPC ............. *G06F 3/061* (2013.01); *G06F 3/064* (2013.01); *G06F 3/0652* (2013.01);
   (Continued)

(58) Field of Classification Search
   CPC ........ G06F 3/061; G06F 3/064; G06F 3/0652; G06F 3/0655; G06F 3/0679
   (Continued)

(56) References Cited

U.S. PATENT DOCUMENTS

| | | | | |
|---|---|---|---|---|
| 5,901,083 A | * | 5/1999 | Atsumi .................. | G11C 16/16 365/185.11 |
| 2007/0147117 A1 | * | 6/2007 | Nagao .................... | G11C 16/16 365/185.11 |

(Continued)

FOREIGN PATENT DOCUMENTS

| | | |
|---|---|---|
| KR | 1020140028738 A | 3/2014 |
| KR | 1020140089792 A | 7/2014 |

*Primary Examiner* — Harry W Byrne
(74) *Attorney, Agent, or Firm* — William Park & Associates Ltd.

(57) ABSTRACT

Provided herein may be a semiconductor memory device that may include a plurality of memory blocks configured to share bit lines and a common source line, a voltage generation circuit configured to apply an erase voltage to the common source line, and operation voltages to word lines and select lines of the plurality of memory blocks during an erase operation, a read and write circuit configured to check a program and erase status of an unselected memory block of the plurality of memory blocks during the erase operation, and a control logic configured to control the voltage generation circuit so that the operation voltages applied to select lines of a selected memory block are controlled in accordance with a result of checking the program and erase status of the unselected memory block during the erase operation.

7 Claims, 8 Drawing Sheets

(51) Int. Cl.
 *G11C 16/30* (2006.01)
 *G11C 16/10* (2006.01)
 *G11C 16/04* (2006.01)

(52) U.S. Cl.
 CPC .......... *G06F 3/0655* (2013.01); *G06F 3/0679* (2013.01); *G11C 16/10* (2013.01); *G11C 16/16* (2013.01); *G11C 16/30* (2013.01); *G11C 16/0483* (2013.01)

(58) Field of Classification Search
 USPC .................................................... 365/185.11
 See application file for complete search history.

(56) References Cited

U.S. PATENT DOCUMENTS

| | | | | |
|---|---|---|---|---|
| 2013/0194868 | A1* | 8/2013 | Hashimoto | G11C 16/0483 365/185.11 |
| 2015/0003156 | A1* | 1/2015 | Berckmann | G11C 29/88 365/185.09 |
| 2015/0332773 | A1* | 11/2015 | Kwak | G11C 16/10 365/185.11 |

* cited by examiner

CONTROL LOGIC, SEMICONDUCTOR MEMORY DEVICE, AND OPERATING METHOD

CROSS-REFERENCE TO RELATED APPLICATION

The present application is a divisional application for U.S. patent application Ser. No. 15/642,606, filed on Jul. 6, 2017, and claims priority under 35 U.S.C. § 119(a) to Korean patent application number 10-2016-0182710 filed on Dec. 29, 2016 in the Korean Intellectual Property Office, the entire disclosure of which is incorporated herein by reference.

BACKGROUND

1. Technical Field

Various embodiments of the present disclosure may generally relate to an electronic device, and more particularly, to a control logic, semiconductor memory device, and an operating method.

2. Related Art

Semiconductor devices, in particular, semiconductor memory devices are classified into a volatile memory device and a nonvolatile memory device.

The nonvolatile memory devices can maintain data stored therein even when a supply of power is interrupted, although read and write speeds are comparatively lower. Therefore, nonvolatile memory devices are used when there is a need for storing data which must be maintained regardless of whether power is supplied. Representative examples of nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), Ferroelectric RAM (FRAM), etc. Flash memory is classified into NOR type memory and NAND type memory.

Flash memory has advantages of both RAM and ROM types. In RAM, data is programmable and erasable. In ROM, data may be stored therein and retained even when power is interrupted. Such a flash memory may be widely used as a storage medium of portable electronic devices such as a digital camera, a personal digital assistant (PDA), and an MP3 player.

Flash memory devices may be classified into a two-dimensional semiconductor device in which strings are horizontally formed on a semiconductor substrate, and a three-dimensional semiconductor device in which strings are vertically formed on the semiconductor substrate.

SUMMARY

In an embodiment of the present disclosure, a semiconductor memory device may be provided. The semiconductor memory device may include a plurality of memory blocks configured to share bit lines and a common source line. The semiconductor memory device may include a voltage generation circuit configured to apply an erase voltage to the common source line, and operation voltages to word lines and select lines of the plurality of memory blocks in an erase operation. The semiconductor memory device may include a read and write circuit configured to check a program and erase status of an unselected memory block of the plurality of memory blocks during the erase operation. The semiconductor memory device may include a control logic configured to control the voltage generation circuit so that the operation voltages applied to select lines of the select lines are controlled in accordance with a result of checking the program and erase status of the unselected memory block during the erase operation.

In an embodiment of the present disclosure, an operating method of a semiconductor memory device may be provided. The operating method may include providing at least two memory blocks sharing a common source line and a plurality of bit lines. The operating method may include checking a program and erase status of an unselected memory block between the at least two memory blocks, setting a drain select line voltage and a source select line voltage applied to a selected memory block between the at least two memory blocks to be different from each other when the unselected memory block is in the program status. The operating method may include applying a drain select line voltage and a source select line voltage to the selected memory block at the same time when applying a pre-erase voltage to the common source line. The operating method may include applying an erase voltage to the common source line.

In an embodiment of the present disclosure, a control logic may be provided. The control logic may include a read-only memory (ROM) configured to store an algorithm for performing operations of a semiconductor memory device, and to generate and output an internal control signal based on a command. The control logic may include a register configured to store information indicating whether a plurality of memory blocks included in a memory cell array are programmed or erased and output a program and erase status signal of an unselected memory block sharing bit lines and a common source line during an erase operation. The control logic may include an operation voltage control signal generation circuit configured to generate control signals for controlling potential levels of voltages applied to a source select line and a drain select line of the selected memory block during the erase operation based on the internal control signal and the program and erase status signal.

DETAILED DESCRIPTION

Figure 1:
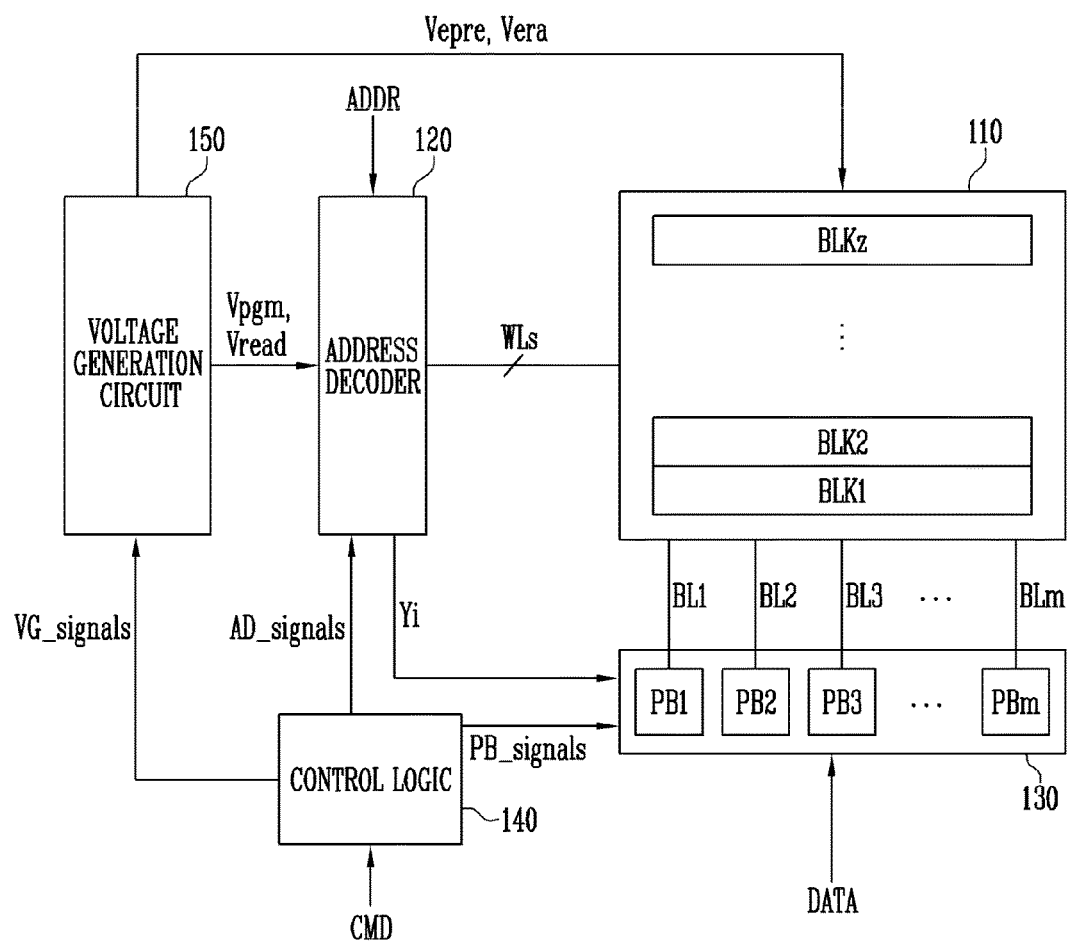
FIG. 1 is a block diagram illustrating a semiconductor memory device according to an embodiment of the present disclosure.

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey a scope of example embodiments to those skilled in the art.

In the drawing figures, dimensions may be exaggerated for clarity of illustration. It will be understood that when an element is referred to as being "between" two elements, the element can be the only element between the two elements, or one or more intervening elements may also be present. Like reference numerals refer to like elements throughout.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

An embodiment of the present disclosure may relate to a semiconductor memory device capable of improving erase efficiency in an erase operation of the semiconductor memory device and an operation method thereof.

FIG. 1 is a block diagram illustrating a semiconductor memory device according to an embodiment of the present disclosure.

Referring to FIG. 1, a semiconductor memory device 100 may include a memory cell array 110, an address decoder 120, a read and write circuit 130, a control logic 140, and a voltage generation circuit 150.

The address decoder 120, the read and write circuit 130, and the voltage generation circuit 150 may be defined as peripheral circuits for performing an erase operation on the memory cell array 110.

The memory cell array 110 may include a plurality of memory blocks BLK1 to BLKz. The plurality of memory blocks BLK1 to BLKz may be coupled to the address decoder 120 via word lines WLs. The plurality of memory blocks BLK1 to BLKz may be coupled to the read and write circuit 130 via bit lines BL1 to BLm. Each of the plurality of memory blocks BLK1 to BLKz may include a plurality of memory cells. According to an embodiment, the plurality of memory cells may be non-volatile memory cells, and more specifically, the plurality of memory cells may be non-volatile memory cells based on a charge trap device. A plurality of memory cells commonly coupled to the same word line may be defined as one page. The memory cell array 110 may include a plurality of pages. In addition, each of the plurality of memory blocks BLK1 to BLKz of the memory cell array 110 may include a plurality of string cells. Each of the plurality of string cells may include a drain select transistor, a plurality of memory cells, and a source select transistor coupled in series between a bit line and a source line.

The plurality of memory blocks BLK1 to BLKz included in the memory cell array 110 may include at least two memory blocks that share a common source line and the bit line. A description thereof will be described below.

The address decoder 120 may be coupled to the memory cell array 110 via the word lines WL. The address decoder 120 may be configured to operate in response to control signals AD_signals output from the control logic 140. The address decoder 120 may receive an address ADDR through an input and output (input/output) buffer (not illustrated) in the semiconductor memory device 100.

The address decoder 120 may control the word lines WLs of a selected memory block in a floating status during the erase operation. In addition, the address decoder 120 may apply a pass voltage to the word lines WLs of an unselected memory block during the erase operation. In addition, the address decoder 120 may apply a read voltage Vread to the plurality of word lines WL of the memory cell array 110 during a read operation for checking a program and erase (program/erase) status of the unselected memory block sharing the common source line and the bit line with the selected memory block during the erase operation.

In addition, the address decoder 120 may apply a program voltage Vpgm or the read voltage Vread generated by the voltage generation circuit 150 to the plurality of word lines WLs of the memory cell array 110 during the program operation or the read operation.

The address ADDR received at the request of the erase operation of the semiconductor memory device may include a block address, and the address decoder 120 may select at least one memory block according to the block address.

In addition, the address ADDR received during all the operations of the semiconductor memory device may include the block address, a row address, and a column address. The address decoder 120 may select one memory block and one word line according to the block address and the row address. A column address Yi may be decoded by the address decoder 120 and provided to the read and write circuit 130.

The address decoder 120 may include a block decoder, a row decoder, a column decoder, and an address buffer.

The read and write circuit 130 may include a plurality of page buffers PB1 to PBm. The plurality of page buffers PB1 to PBm may be coupled to the memory cell array 110 through the bit lines BL1 to BLm. Each of the plurality of page buffers PB1 to PBm may perform a read operation of content addressable memory (CAM) cells included in the unselected memory block during the read operation for checking the program/erase status of the unselected memory block sharing the common source line and the bit lines with the selected memory block during the erase operation, a read operation of at least one page of the unselected memory block, or a read operation of all pages of the unselected memory block, thereby checking the program/erase status of the unselected memory block.

During the program operation, each of the plurality of page buffers PB1 to PBm may temporarily store data DATA input and control potential levels of bit lines BL1 to BLm corresponding to the temporarily stored data, respectively. During the read operation, the read and write circuit 130 may sense the potential levels or the current amounts of the bit lines BL1 to BLm, temporarily store read data, and output the read data to an outside.

The read and write circuit 130 may operate in response to control signals PB_signals output from the control logic 140.

The control logic 140 may be coupled to the address decoder 120, the read and write circuit 130, and the voltage generation circuit 150. The control logic 140 may receive a command CMD through the input and output (input/output) buffer (not illustrated) of the semiconductor memory device 100. The control logic 140 may control all the operations of the semiconductor memory device 100 in response to the command CMD.

When the command CMD corresponding to the erase operation is input, the control logic 140 may check the program/erase status of the unselected memory block sharing the common source line and the bit lines with the selected memory block and control the address decoder 120 and the voltage generation circuit 150 according to a result thereof so that potential levels of the source select line and the drain select line may be adjusted in the erase operation of the selected memory block. For example, when the selected memory block sharing the common source line and the bit lines with the selected memory block is programmed, the control logic 140 may control a potential level of the source select line to be higher than a potential level of the drain select line during the erase operation of the selected memory block, and when the unselected memory block sharing the common source line and the bit lines with the selected memory block is erased, the control logic 140 may control the potential level of the source select line to be the equal to the potential level of the drain select line during the erase operation of the selected memory block.

The voltage generation circuit 150 may operate in response to control signals VG_signals output from the control logic 140.

The voltage generation circuit 150 may sequentially generate a pre-erase voltage Vepre and an erase voltage Vera in accordance with control of the control logic 140 during the erase operation and supply the pre-erase voltage Vepre and the erase voltage Vera to the selected memory blocks of the plurality of memory blocks BLK1 to BLKz via the common source line of the memory cell array 110. The voltage generation circuit 150 may generate and output voltages applied to the source select line and the drain select line of the selected memory block in the erase operation in response to the control of the control logic 140 to have different potential levels from each other or the same potential level. The voltage generation circuit 150 may generate and output a pass voltage to be applied to the drain select line, the word lines, and the source select line of the unselected memory block in the erase operation in response to the control of the control logic 140. The pass voltage may have a potential level at which the plurality of select transistors and the memory cells included in the unselected memory block are turned on.

The voltage generation circuit 150 may generate the read voltage Vread during the read operation for checking the program/erase status of the unselected memory sharing the common source line and the bit line with the selected memory block during the erase operation.

The voltage generation circuit 150 may generate the program voltage Vpgm or the read voltage Vread in response to the control of the control logic 140 during the program operation or the read operation.

Figure 2:
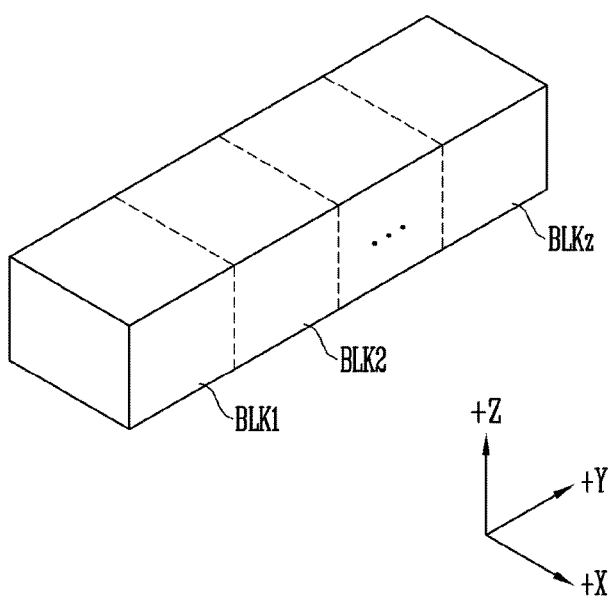
FIG. 2 is a block diagram illustrating an embodiment of a memory cell array of FIG. 1.

FIG. 2 is a block diagram illustrating an embodiment of a memory cell array of FIG. 1.

Referring to FIG. 2, the memory cell array 110 may include the plurality of memory blocks BLK1 to BLKz. Each memory block may have a three-dimensional structure. Each memory block may include the plurality of memory cells stacked on a substrate. The plurality of memory cells may be arranged in an +X direction, a +Y direction, and a +Z direction. The structure of each memory block will be described with reference to FIG. 3 below.

Figure 3:
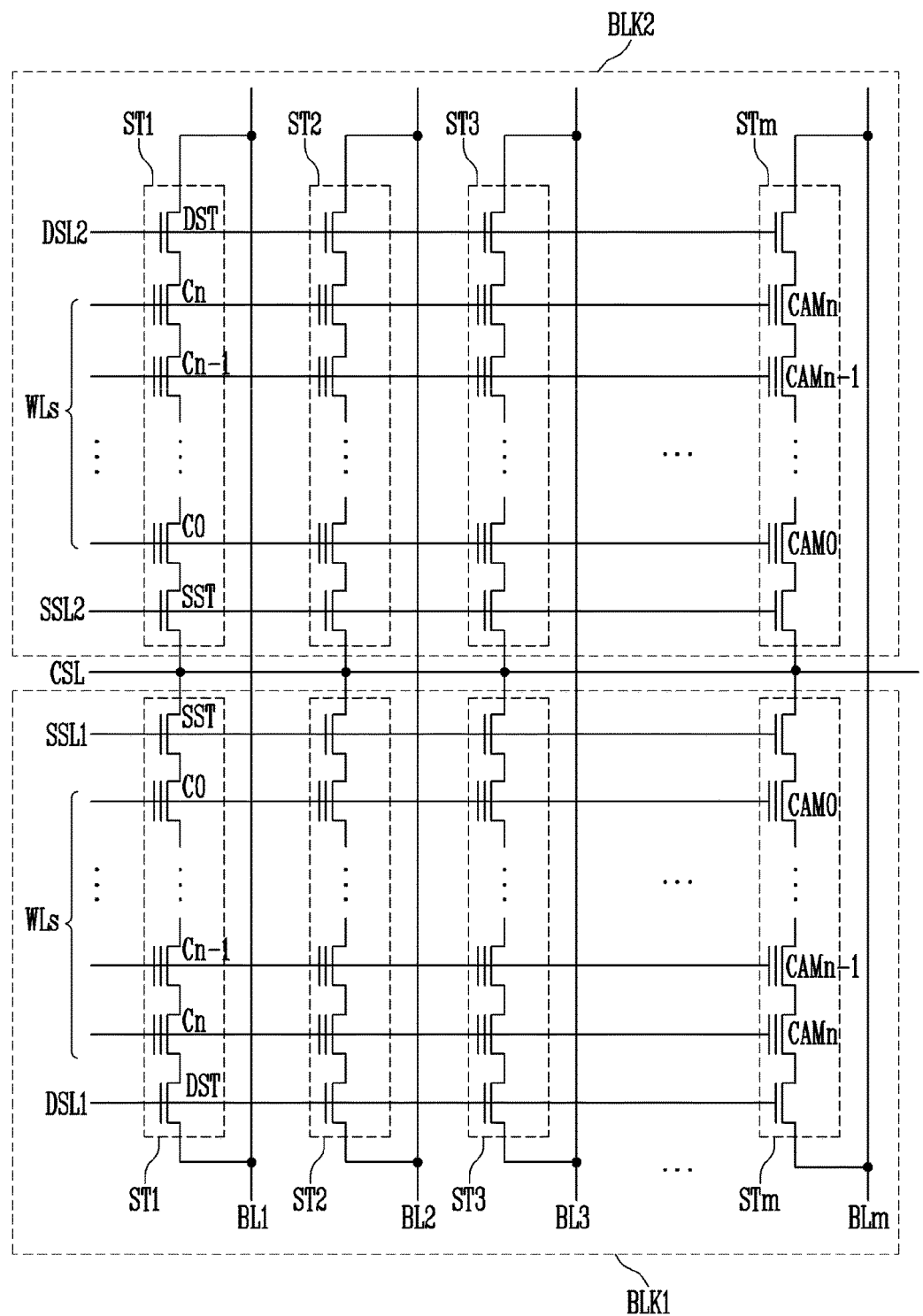
FIG. 3 is a circuit diagram illustrating memory blocks of FIG. 1.

FIG. 3 is a circuit diagram illustrating memory blocks of FIG. 1.

The plurality of memory blocks BLK1 to BLKz illustrated in FIG. 1 may be coupled to the read and write circuit 130 through the bit lines BL1 to BLm. However, the memory blocks BLK1 and BLK2 will be representatively illustrated for the shake of illustration and description of FIG. 3. The memory block BLK1 and the memory block BLK2 may share the bit lines BL1 to BLm and a common source line CSL.

Referring to FIG. 3, the memory block BLK1 and the memory block BLK2 may be coupled to the plurality of bit lines BL1 to BLm.

The memory block BLK1 may include a plurality of cell strings ST1 to STm. Each of the plurality of cell strings ST1 to STm may be coupled between each of the plurality of bit lines BL1 to BLm and the common source line CSL. Each of the plurality of cell strings ST1 to STm may include a source select transistor SST, a plurality of memory cells C0 to Cn coupled in series, and a drain select transistor DST. The source select transistor SST may be coupled to a source select line SSL1. The plurality of memory cells C0 to Cn may be coupled to the word lines WLs, respectively. The drain select transistor DST may be coupled to a drain select line DSL1. The common source line CSL may be coupled to a source side of the source select transistor SST. Each of the bit lines BL1 to BLm may be coupled to a drain side of the corresponding drain select transistor DST.

The memory block BLK2 may have a similar structure to the memory block BLK1. That is, the memory block BLK2 may include the plurality of cell strings ST1 to STm, and each of the plurality of cell strings ST1 to STm may be coupled between each of the plurality of bit lines BL1 to BLm and the common source line CSL. Each of the plurality of cell strings ST1 to STm may include the source select transistor SST, the plurality of memory cells C0 to Cn coupled in series, and the drain select transistor DST. The source select transistor SST may be coupled to a source select line SSL2. The plurality of memory cells C0 to Cn may be coupled to the word lines WLs, respectively. The drain select transistor DST may be coupled to a drain select line DSL2. The common source line CSL may be coupled to the source side of the source select transistor SST. Each of the bit lines BL1 to BLm may be coupled to the drain side of the corresponding drain select transistor DST.

Each of the memory block BLK1 and the memory block BLK2 may include CAM cells CAM0 to CAMn. According to an embodiment of the present disclosure, the cell string STm included in each of the memory block BLK1 and the memory block BLK2 may include the CAM cells CAM0 to CAMn. The CAM cells CAM0 to CAMn may store information indicating whether or not a program operation is performed in the corresponding memory block.

As described above, the memory block BLK1 and the memory block BLK2 may have similar structures, and the drain select lines DSL1 and DSL2 respectively coupled to the memory block BLK1 and the memory block BLK2 may be designed to be electrically separated from each other.

Figure 4:
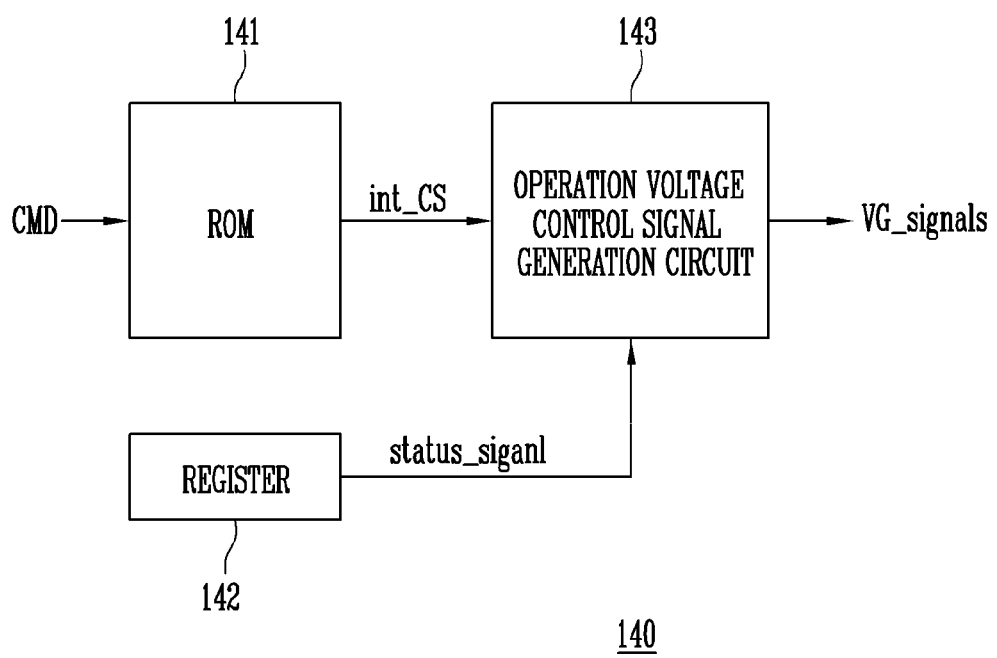
FIG. 4 is a block diagram illustrating an embodiment of a control logic of FIG. 1.

FIG. 4 is a block diagram illustrating an embodiment of a control logic of FIG. 1.

Referring to FIG. 4, the control logic 140 may include a ROM 141, a register 142, and an operation voltage control signal generation circuit 143.

The ROM 141 may store an algorithm for performing all the operations of the semiconductor memory device, and generate and output an internal control signal int_CS in response to the command CMD input from an outside, for example, a host coupled to the semiconductor memory device.

The register 142 may store information indicating whether the plurality of memory blocks BLK1 to BLKz included in the memory cell array 110 of FIG. 1 are programmed or erased. The information indicating the statuses of the plurality of memory blocks BLK1 to BLKz may be updated during the program operation of the selected memory block or during the read operation for checking the program/erase status of the unselected memory block sharing the bit lines and the common source line with the selected memory block during the erase operation of the selected memory block.

The register 142 may output a program/erase status signal status_signal of the unselected memory block sharing the bit lines and the common source line during the erase operation.

In response to the internal control signal int_CS and the program/erase status signal status_signal, the operation voltage control signal generation circuit 143 may generate and output the control signals VG_signals for controlling potential levels of the voltages applied to the source select line and the drain select line of the selected memory block during the erase operation.

Figure 5:
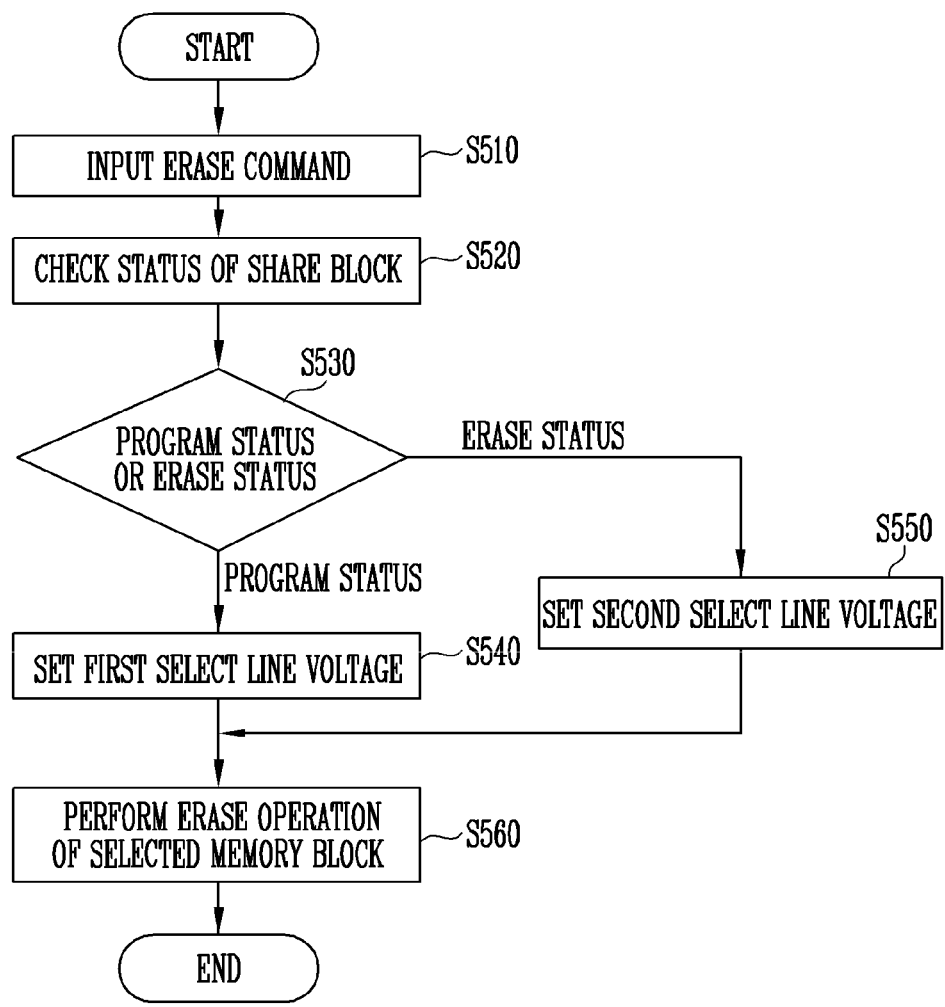
FIG. 5 is a flow chart illustrating an operation method of the semiconductor memory device according to an embodiment of the present disclosure.

FIG. 5 is a flow chart illustrating an operation method of the semiconductor memory device according to an embodiment of the present disclosure.

Figure 6A:
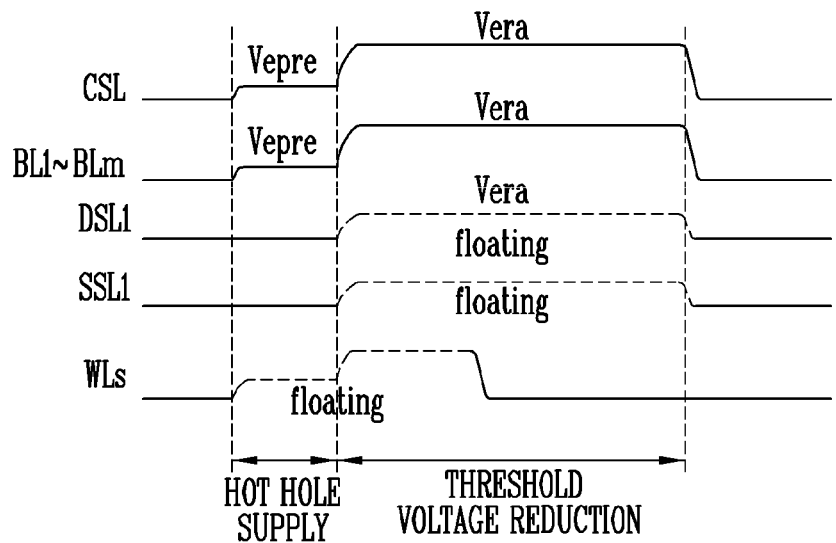
FIGS. 6A and 6B are waveform diagrams of signals for illustrating the operation method of the semiconductor memory device according to an embodiment of the present disclosure.
Figure 6B:
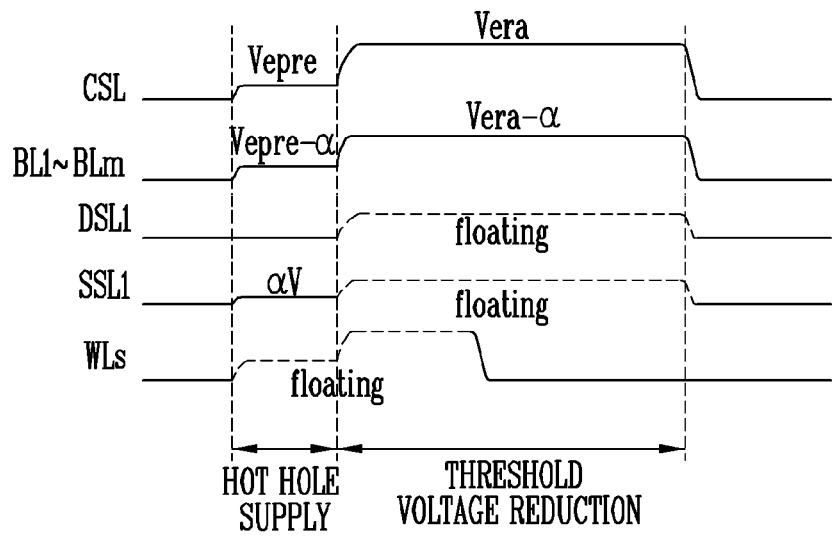

FIGS. 6A and 6B are waveform diagrams of signals for illustrating the operation method of the semiconductor memory device according to an embodiment of the present disclosure. For example, FIG. 6A is a waveform diagram of signals for illustrating the unselected memory block sharing the bit lines and the common source line with the selected memory block in an erase status, and FIG. 6B is a waveform diagram of signals for illustrating the unselected memory block sharing the bit lines and the common source line with the selected memory block in a program status.

According to an embodiment of the present disclosure, the unselected memory block sharing the bit lines and the common source line with the selected memory block will be defined as a share memory block.

An operation of the semiconductor memory device according to an embodiment of the present disclosure with reference to FIGS. 1 to 6B will be described as below.

According to an embodiment of the present disclosure, an operation of selectively erasing the memory block BLK1, among the plurality of memory blocks BLK1 to BLKz, will be used an example.

When the command CMD for an erase command is input from the outside (S510), the control logic 140 may control the program/erase status of the memory block BLK2 (hereinafter, "share memory block BLK2") sharing the bit lines BL1 to BLm and the common source line CSL with the selected memory block BLK1 (S520).

A method of checking the program/erase status of the share memory block BLK2 is as follows.

1) Check the program/erase status of the share memory block BLK2 by reading at least one set page, among a plurality of pages included in the share memory block BLK2.

The control logic 140 may control the voltage generation circuit 150 to generate the read voltage Vread and the pass voltage. The address decoder 120 may apply the read voltage Vread generated by the voltage generation circuit 150 to a word line coupled to one of the set pages, among the plurality of word lines WLs of the share memory block BLK2, and the pass voltage to the remaining word lines.

In response to the control of the control logic 140, the read and write circuit 130 may sense the potential levels or the current amounts of the bit lines BL1 to BLm to determine whether there is at least one memory cell whose threshold voltage is in the program status, among memory cells included in a selected page. For example, when at least one memory cell is in the program status, the read and write circuit 130 may determine that the share memory block BLK2 is in the program status and output a result thereof to the register 142 of the control logic 140. On the contrary, when all of the memory cells are in the erase status, the read and write circuit 130 may determine that the share memory block BLK2 is in the erase status and output a result thereof to the register 142 of the control logic 140.

That is, the program/erase status of the share memory block BLK2 may be determined by performing a read operation of the set page, among the plurality of pages included in the share memory block BLK2.

2) Check the program/erase status of the share memory block BLK2 by simultaneously or substantially simultaneously reading the plurality of pages included in the share memory block BLK2. [Relative broadening amendments were made to original paragraph 74, 77, The control logic 140 may control the voltage generation circuit 150 to generate the read voltage Vread. The address decoder 120 may apply the read voltage Vread generated by the voltage generation circuit 150 to all the word lines WLs of the share memory block BLK2.

The read and write circuit 130 may sense the potential levels or the current amounts of the bit lines BL1 to BLm in response to the control of the control logic 140 to determine whether there is at least one memory cell in which the threshold voltage thereof is in the program status, among memory cells included in all the pages. For example, when at least one memory cell is in the program status, the read and write circuit 130 may determine that the share memory block BLK2 is in the program status and output a result thereof to the register 142 of the control logic 140. On the contrary, when all of the memory cells are in the erase status, the read and write circuit 130 may determine that the share memory block BLK2 is in the erase status and output a result thereof to the register 142 of the control logic 140.

That is, the program/erase status of the share memory block BLK2 may be determined by simultaneously or substantially simultaneously reading the plurality of pages included in the share memory block BLK2.

3) Check the program/erase status of the share memory block BLK2 by performing a CAM cell read operation of the share memory block BLK2.

The control logic 140 may control the voltage generation circuit 150 to generate the read voltage Vread. The address decoder 120 may apply the read voltage Vread generated by the voltage generation circuit 150 to a set word line, among the plurality of word lines WLs of the share memory block BLK2.

The read and write circuit 130 may sense the potential level or the current amount of the bit line BLm coupled to the CAM cells CAM0 to CAMn, among the bit lines BL1 to BLm to perform the read operation in response to the control of the control logic 140. The read and write circuit 130 may determine that the share memory block BLK2 is in the program status or the erase status in response to a read operation result and output a result thereof to the register 142 of the control logic 140.

4) Store information whether the program operation is performed during the program operation of the share memory block BLK2.

During the program operation of the semiconductor memory device, information on a memory block on which the program operation is performed may be stored in the register 142 of the control logic 140. Subsequently, whether the share memory block BLK2 is programmed may be determined based on the data stored in the register 142 during the erase operation.

The program/erase status of the share memory block BLK2 may be checked by using one of the four methods described above.

The register 142 of the control logic 140 may output the program/erase status signal status_signal according to the program status/erase status of the share memory block BLK2. The operation voltage control signal generation circuit 143 may determine the program status/erase status of the share memory block BLK2 in response to the internal control signal int_CS and the program/erase status signal status_signal (S530) and generate and output the control signals VG_signals for controlling the potential levels of the voltages applied to the source select line and the drain select line of the selected memory block during the erase operation.

For example, when the share memory block BLK2 is in the program status, the control signal generation circuit 143 may generate and output the control signals VG_signals so that the potential levels of the source select line voltage and the drain select line voltage applied to the source select line SSL1 and the drain select line DSL1 of the selected memory block BLK1 may be different from each other. For example, the control signal generation circuit 143 may set a voltage applied to the source select line SSL1 of the selected memory block BLK1 to be a first select line voltage αV and a voltage applied to the drain select line DSL1 to be a ground voltage, thereby generating and outputting the control signals VG_signals (S540).

When the share memory block BLK2 is in the erase status, the control signal generation circuit 143 may generate and output the control signals VG_signals so that the potential levels of the source select line voltage and the drain select line voltage applied to the source select line SSL1 and the drain select line DSL1 of the selected memory block BLK1 may be equal to each other. For example, the control signal generation circuit 143 may generate and output the control signals VG_signals to set the voltage applied to the source selection line SSL1 and the voltage applied to the drain selection line DSL1 of the selected memory block BLK1 to be a second select line voltage (a ground voltage) (S550).

The share memory block BLK2 in an erase status will be described as follows.

The voltage generation circuit 150 may generate the pre-erase voltage Vepre to be applied to the common source line CSL coupled to the selected memory block BLK1. In addition, the voltage generation circuit 150 may generate and output the pass voltage, and the address decoder 120 may apply the pass voltage to the word lines WLs, the drain select line DSL2, and the source select line SSL2 of the share memory block BLK2. As a result, the pre-erase voltage Vepre applied to the common source line CSL may be transmitted to the bit lines BL1 to BLm through the plurality of cell strings ST1 to STm of the share memory block BLK2. Since the share memory block BLK2 is in the erase status, resistance values of the plurality of cell strings ST1 to STm may be low, so that potential levels of the common source line CSL and the bit lines BL1 to BLm may be the level of the pre-erase voltage Vepre.

The address decoder 120 may control the word lines WLs of the selected memory block BLK1 in the floating status and apply the second select line voltage to each of the drain select line DSL1 and the source select line SSL1. The second select line voltage may be the ground voltage. At lower channels of the drain select transistor DST and the source select transistor SST of the selected memory block BLK1, a gate-induced drain leakage (GIDL) current may be generated by the pre-erase voltage Vepre applied to the common source line CSL and the bit lines BL1 to BLm, and hot holes generated by the GIDL current may be supplied to channel layers of the plurality of cell strings ST1 to STm.

The voltage generation circuit 150 may generate the erase voltage Vera to be applied to the common source line CSL coupled to the selected memory block BLK1. The erase voltage Vera applied to the common source line CSL may be transmitted to the bit lines BL1 to BLm through the plurality of cell strings ST1 to STm of the share memory block BLK2.

The drain select line DSL1 and the source select line SSL1 of the selected memory block BLK1 may be controlled to be in the floating status. The word lines WLs, the drain select line DSL1, and the source select line SSL1 in the floating status may be raised by a capacitor coupling phenomenon due to the erase voltage Vera applied to the common source line CSL and the bit lines BL1 to BLm.

Subsequently, when potential levels of the word lines WLs are discharged to a ground voltage level, in the voltage generation circuit 150 and the address decoder 120, a voltage difference between channels of the word lines WLs and the cell strings ST1 To STm may be sufficiently increased and electrons trapped in charge storage layers of the memory cells C0 to Cn included in the selected memory block BLK1 may be discharged to a channel. As a result, threshold voltages of the memory cells C0 to Cn may be reduced and the memory cells C0 to Cn may be erased accordingly (S560).

The share memory block BLK2 in the program status will be described as follows.

The voltage generation circuit 150 may generate the pre-erase voltage Vepre to be applied to the common source line CSL coupled to the selected memory block BLK1. In addition, the voltage generation circuit 150 may generate and output the pass voltage, and the address decoder 120 may apply the pass voltage to the word lines WLs, the drain select line DSL2, and the source select line SSL2 of the share memory block BLK2. As a result, the pre-erase voltage Vepre applied to the common source line CSL may be transmitted to the bit lines BL1 to BLm through the plurality of cell strings ST1 to STm of the share memory block BLK2. Since the share memory block BLK2 is in the program status, the resistance values of the plurality of cell strings ST1 to STm may be high, so that the potential levels of the bit lines BL1 to BLm may be the level of an erase voltage Vepre-α, which is lower than the level of the pre-erase Vepre applied to the common source line CSL. As a result, the potential levels of the bit lines BL1 to BLm may be lower than a potential level of the common source line CSL.

The address decoder 120 may control the word lines WLs of the selected memory block BLK1 in the floating status and apply the drain select line voltage and the source select line voltage to the drain select line DSL1 and the source select line SSL1, respectively. The drain select line voltage may be the ground voltage, and the source select line voltage may be the first select line voltage αV higher than the ground voltage. Therefore, although the potential levels of the common source line CSL and the bit lines BL1 to BLm are different from one another, the source select line voltage applied to the source selection line SSL1 and the drain select line voltage applied to the drain selection line DSL1 may be different from each other, thereby controlling the GIDL current generated at lower channels of the drain select transistor DST and the source select transistor SST to be uniform. The hot holes generated by the GIDL current may be supplied to a channel layer of the plurality of cell strings ST1 to STm. As a result, due to the difference in GIDL current amount, erase speeds of the memory cell MC0 adjacent to the common source line CSL and the memory cell Cn adjacent to the bit lines BL1 to BLm may be balanced against each other.

The voltage generation circuit 150 may generate the erase voltage Vera to be applied to the common source line CSL coupled to the selected memory block BLK1. The erase voltage Vera applied to the common source line CSL may be transmitted to the bit lines BL1 to BLm through the plurality of cell strings ST1 to STm of the share memory block BLK2. Since the share memory block BLK2 is in the program status, the resistance values of the plurality of cell strings ST1 to STm may be high, so that the potential levels of the bit lines BL1 to BLm may be the level of an erase voltage Vera-α, which is lower than the level of the erase voltage Vera applied to the common source line CSL.

The drain select line DSL1 and the source select line SSL1 of the selected memory block BLK1 may be controlled in the floating status. The word lines WLs, the drain select line DSL1, and the source select line SSL1 in the floating status may be raised by the capacitor coupling phenomenon by the erase voltages Vera and Vera-α applied to the common source line CSL and the bit lines BL1 to BLm.

When the voltage levels of the word lines WLs are discharged to the ground voltage level, in the voltage generation circuit 150 and the address decoder 120, the voltage difference between the channels of the word lines WLs and the cell strings ST1 To STm may be sufficiently increased and the electrons trapped in the charge storage layer of the memory cells C0 to Cn included in the selected memory block BLK1 may be discharge to the channel. As a result, the threshold voltage may be reduced and the electrons may be erased accordingly.

Figure 7:
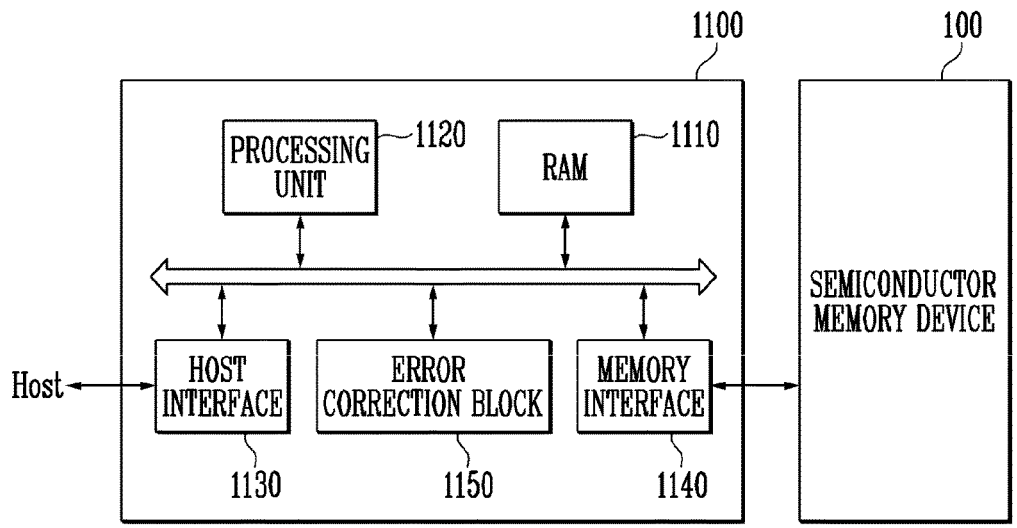
FIG. 7 is a block diagram illustrating a memory system including the semiconductor memory device of FIG. 1.

FIG. 7 is a block diagram illustrating a memory system including the semiconductor memory device of FIG. 1.

Referring to FIG. 7, a memory system 1000 may include the semiconductor memory device 100 and a controller 1100.

The semiconductor memory device 100 may be the same as the semiconductor memory devices described with reference to FIG. 1, and a redundant description will be omitted below.

The controller 1100 may be coupled to a host Host and the semiconductor memory device 100. In response to a request from the host Host, the controller 1100 may be configured to access the semiconductor memory device. For example, the controller 1100 may be configured to control read, write, erase, and background operations of the semiconductor memory device 100. The controller 1100 may be configured to provide an interface between the semiconductor memory device 100 and the host Host. The controller 1100 may be configured to drive firmware for controlling the semiconductor memory device 100.

The controller 1100 may include a random access memory 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host and a buffer memory between the semiconductor memory device 100 and the host Host. The processing unit 1120 may control all operations of the controller 1100. The controller 1100 may temporarily store program data provided from the host Host during the write operation. Information on the program status/erase statuses of the memory blocks stored in the control logic 140 of FIG. 1 according to an embodiment of the present disclosure may be stored in the processing unit 1120 of the controller 1100.

The host interface 1130 may include a protocol for performing data exchange between the host Host and the controller 1100. As an example of an embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, etc.

The memory interface 1140 may interface with the semiconductor memory device 100. For example, the memory interface 140 may include a NAND interface or a NOR interface.

The error correction block 1150 may be configured to detect and correct errors of data received from the semiconductor memory device 100 by using an error correcting code (ECC). The processing unit 1120 may control the semiconductor memory device 100 to adjust the read voltage according to an error detection result of the error correction block 1150 and perform a re-read operation. In an example of an embodiment, the error correction block may be provided as a constituent of the controller 1100.

The controller 1100 and the semiconductor memory device 100 may be integrated into one semiconductor device. As an example of an embodiment, the controller 1100 and the semiconductor memory device 100 may be integrated into one semiconductor device to form a memory card. For example, the controller 1100 and the semiconductor memory device 100 may be integrated into one semiconductor device and form a memory card such as a PC card, which is a personal computer memory card international association (PCMCIA), a compact flash card (CF), a smart media card (SM and SMC), a memory stick, a multimedia card (MMC, RS-MMC, and MMCmicro), an SD card (SD, miniSD, microSD, and SDHC), a universal flash storage (UFS), and the like.

The controller 1100 and the semiconductor memory device 100 may be integrated into one semiconductor device to form a solid status drive SSD. The solid status drive SSD may include a storage device configured to store data in a semiconductor memory. When the memory system 1000 is used as the solid status drive SSD, an operation speed of the host Host coupled to a memory system 1000 may be remarkably improved.

In an embodiment, the memory system 1000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

In an example of an embodiment, the semiconductor memory device 100 or the memory system 1000 may be embedded in packages of various forms. For example, the semiconductor memory device 100 or the memory system 1000 may be embedded in packages such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline Integrated Circuit (SOIC), a shrink small outline package (SSOP), a thin small outline (TSOP), a thin quad flatpack (TQFP), a system in package (SIP), a multichip package (MCP), a wafer-level fabricated package (WFP), a wafer-level processed stack package (WSP), or the like.

Figure 8:
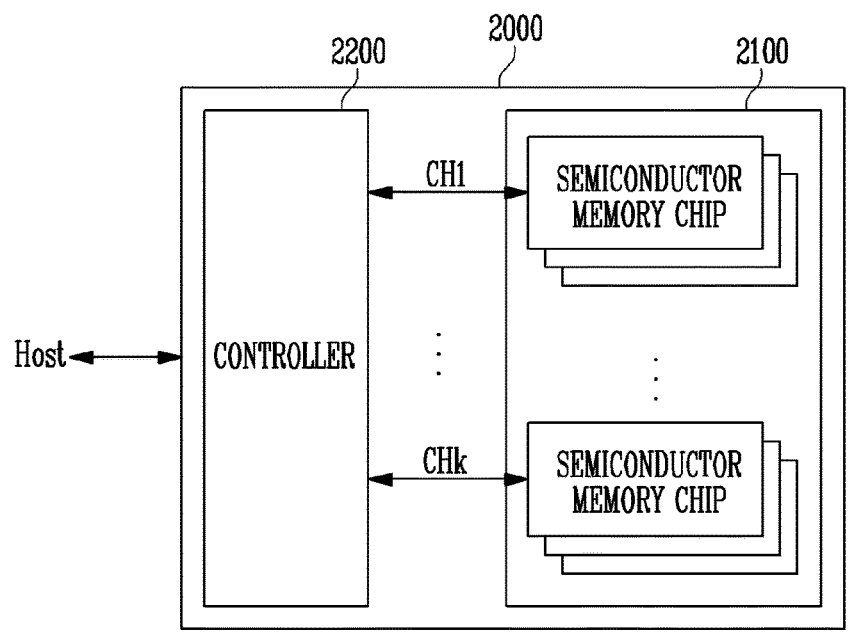
FIG. 8 is a block diagram illustrating an application example of the memory system of FIG. 7.

FIG. 8 is a block diagram illustrating an application example of the memory system of FIG. 7.

Referring to FIG. 8, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

Referring to FIG. 8, the plurality of groups of memory chips may communicate with the controller 2200 via first to kth channels CH1 to CHk. Each memory chip may be configured and operate as one of the semiconductor memory devices described with reference to FIG. 1.

Each group of memory chips may be configured to communicate with the controller 2200 via one common channel. The controller 2200 may be configured similarly to the controller 1100 described with reference to FIG. 7 and configured to control the plurality of memory chips of the semiconductor memory device 2100 through the plurality of channels CH1 to CHk.

Figure 9:
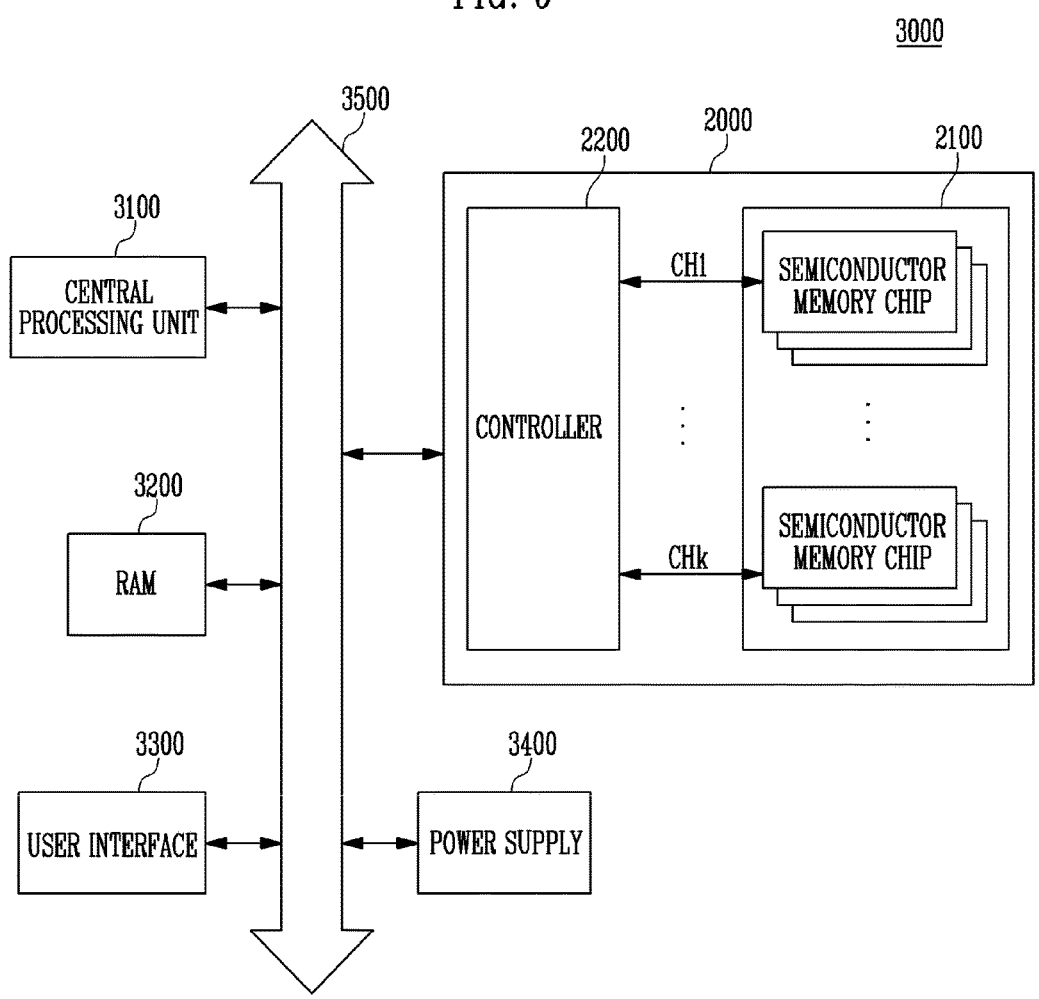
FIG. 9 is a block diagram illustrating a computing system including the memory system described with reference to FIG. 8.

FIG. 9 is a block diagram illustrating a computing system including the memory system described with reference to FIG. 8.

A computing system 3000 may include a central processing unit 3100, a random access memory (RAM) 3200, a user interface 3300, a power supply 3400, a system bus 3500, and the memory system 2000.

The memory system 2000 may be coupled to the central processing unit 3100, the RAM 3200, the user interface 3300, and the power supply 3400 via the system bus 3500. Data provided via the user interface 3300 or processed by the central processing unit 3100 may be stored in the memory system 2000.

Referring to FIG. 9, the semiconductor memory device 2100 may be coupled to the system bus 3500 through the controller 2200. However, the semiconductor memory device 2100 may be configured to be directly coupled to the system bus 3500. The function of the controller 2200 may be performed by the central processing unit 3100 and the RAM 3200.

Referring to FIG. 9, the memory system 2000 described with reference to FIG. 8 may be provided. However, the memory system 2000 may be replaced with the memory system 1000 described with reference to FIG. 7. As an example of an embodiment, the computing system 3000 may be configured to include all of the memory systems 1000 and 2000 described with reference to FIGS. 7 and 8.

According to a present embodiment, a voltage applied to a drain select line and a source select line of a selected memory block may be adjusted in accordance with a program status of an unselected memory block sharing a bit line and a source line with the selected memory block during an erase operation of a semiconductor memory device, thereby stably performing an erase operation of the selected memory block.

While present embodiments have been illustrated and described with reference to certain preferred embodiments thereof, it will be apparent to those skilled in the art that various changes and modifications may be made without departing from the spirit and scope of the disclosure. Therefore, the scope of the present embodiments should not be limited to the above-described embodiments, but should be determined by the equivalents of the claims of the present disclosure as well as the claims of the following.

What is claimed is:

1. An operating method of a semiconductor memory device, the operating method, comprising:
    providing at least two memory blocks sharing a common source line and a plurality of bit lines;
    checking a program and erase (program/erase) status of an unselected memory block between the at least two memory blocks;
    setting a drain select line voltage and a source select line voltage applied to a selected memory block between the at least two memory blocks to be different from each other when the unselected memory block is in the program status;

applying a drain select line voltage and a source select line voltage to the selected memory block at the same time when applying a pre-erase voltage to the common source line; and applying an erase voltage to the common source line.

2. The operating method of claim 1, wherein the drain select line voltage has a lower potential level than the source select line voltage when the unselected memory block is in the program status.

3. The operating method of claim 1, wherein the drain select line voltage and the source select line voltage applied to the selected memory block have a same potential level as each other when the unselected memory block is in the erase status.

4. The operating method of claim 1, wherein a pass voltage is applied to word lines, a drain select line, and a source select line of the unselected memory block when the pre-erase voltage and the erase voltage are applied to the common source line.

5. The operating method of claim 1, wherein the checking of the program status or the erase status of the unselected memory block comprises checking whether the unselected memory block is in the program status or the erase status by performing a read operation on a selected one page from a plurality of pages included in the unselected memory block.

6. The operating method of claim 1, wherein the checking of the program status and erase status of the unselected memory block comprises checking whether the unselected memory block is in the program status or the erase status by performing an operation to substantially simultaneously read a plurality of pages included in the unselected memory block.

7. The operating method of claim 1, wherein the checking of whether the unselected memory block performs a program operation comprises checking whether the unselected memory block is in the program status or the erase status by performing a read operation on content addressable memory (CAM) cells included in the unselected memory block.

* * * * *